United States Patent
Lee

(10) Patent No.: US 7,292,486 B2
(45) Date of Patent: Nov. 6, 2007

(54) METHODS AND CIRCUITS FOR LATENCY CONTROL IN ACCESSING MEMORY DEVICES

(75) Inventor: Sang-bo Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 46 days.

(21) Appl. No.: 11/008,462

(22) Filed: Dec. 9, 2004

(65) Prior Publication Data
US 2005/0128828 A1    Jun. 16, 2005

(30) Foreign Application Priority Data
Dec. 15, 2003  (KR) .................. 10-2003-0091187

(51) Int. Cl.
  *G11C 7/00*  (2006.01)
(52) U.S. Cl. .................. 365/194; 365/190; 365/154
(58) Field of Classification Search ................ 365/194, 365/190, 154
See application file for complete search history.

(56) References Cited
U.S. PATENT DOCUMENTS

| | | | | |
|---|---|---|---|---|
| 4,687,951 A | * | 8/1987 | McElroy ..................... 327/291 |
| 6,078,514 A | | 6/2000 | Takemae et al. ............... 365/63 |
| 6,249,484 B1 | | 6/2001 | Pawlowski .................. 365/233 |
| 6,373,783 B1 | | 4/2002 | Tomita ....................... 365/233 |
| 6,765,423 B2 | * | 7/2004 | Higuchi ...................... 327/270 |
| 7,035,150 B2 | * | 4/2006 | Streif et al. ................. 365/194 |
| 2002/0093872 A1 | * | 7/2002 | Tomita ....................... 365/233 |
| 2004/0196090 A1 | | 10/2004 | Sutherland .................. 327/513 |

FOREIGN PATENT DOCUMENTS

JP    2000285687    11/2001

* cited by examiner

*Primary Examiner*—Amir Zarabian
*Assistant Examiner*—Kretelia Graham
(74) *Attorney, Agent, or Firm*—Myers, Bigel, Sibley & Sajovec, P.A.

(57) ABSTRACT

Methods of providing a delay for access to a memory device can include adjusting a delay for access to data during memory operations based on at least one parameter associated with a reduction in voltage levels provided to the memory. Related circuits are also disclosed.

12 Claims, 6 Drawing Sheets

METHODS AND CIRCUITS FOR LATENCY CONTROL IN ACCESSING MEMORY DEVICES

CROSS-REFERENCE TO RELATED APPLICATION

This application claims priority under 35 USC § 119 to Korean Patent Application No. 2003-91187, filed on Dec. 15, 2003, the contents of which are herein incorporated by reference in their entirety for all purposes.

FIELD OF THE INVENTION

The present invention relates to memory devices, and more particularly to methods and circuits for delays in accessing memory devices.

BACKGROUND

As an operating frequency of a semiconductor memory device has been increasing, a timing margin required for synchronizing an internal signal with an external signal and for detecting/sampling/latching the internal signal has been gradually decreased. Although the memory, such as a Dual Data-Rate (DDR) memory, may support high-speed successive operations, the circuit that supplies power may not operate properly at such frequencies. In particular, the power level may have increased noise or the level of the power may be reduced during such operations. The increase of the power noise increases the variation in the delay in generating a signal (i.e., the delay variation width of the signal). Such a problem may become a factor in the operation of the semiconductor memory at a high frequency.

Particularly, in a circuit for controlling Column Address Strobe (CAS) latency time, that is time interval from inputting of a column address to outputting of predetermined data based on the input column address, the increase of the delay variation width of the signal becomes a factor that induces an erroneous operation of data output timing.

FIG. 1 is a schematic block diagram illustrating a conventional latency control circuit. Referring to FIG. 1, the conventional latency control circuit includes a command decoder 100, a latency signal generator 110, a switching unit 120 and an output buffer 130. The command decoder 100 analyzes an internal command CMD to output an internal activation command PACT synchronized with an external clock ECLK, an internal read command PREAD or an internal write command PWRITE. In addition, the latency signal generator 110 receives the command signals PACT, PREAD or PWRITE to output a latency signal delayed by a predetermined period according to latency information set by a Mode Register Set (MRS), etc. In addition, the switching unit 120 outputs a PTRST signal synchronized with an internal clock ICLK1 which is an output of a delay locked loop (DLL). The PTRST signal is used as a signal for activating the output buffer 130. Furthermore, the output buffer 130 is activated by the activating signal PTRST and receives an internal clock ICLK2 and an output DO from an output latch to output an output data DOUT.

FIG. 2 is a timing diagram illustrating operations of the conventional latency control circuit. Referring to FIG. 2, an internal command signal READ1 detected at a rising edge of a clock CLK1 is converted into the command signal PREAD by the command decoder 100. An internal command signal READ2 detected at the rising edge of a clock CLK4 is converted into the command signal PREAD by the command decoder 100. The activated command signal PREAD is delayed by a predetermined clock at the latency signal generator 110, and thereafter is output as the latency signal. In addition, since the first delay operation occurs at the rising interval of the signal PREAD based on the internal command signal READ1, the power noise is relatively insignificant. However, at the rising interval of the signal PREAD based on the internal command signal READ2, the power noise problem occurs so that VDD and VCC lines may not support the rising of the latency signal due to the relatively high frequency of the external clock ECLK.

In other words, the time interval between read operations may be so short that the levels of VDD and VCC may be reduced by the high frequency switching of the circuits that perform the read operations. The transition speed of the latency signal from a non-active state to art active state may be slowed since the operational speed of the circuits of the latency controller 210 is reduced due to the effects on VDD and VCC. Therefore, the latency signal is delayed. The latency signal is more sensitive to the power noise since the latency signal passes through more circuits of the memory device than the internal clock ICLK1. The internal clock ICLK1 signal is less sensitive to the power noise than the latency signal since the internal clock ICLK1 signal passes through less circuits of the memory device than the latency signal. Namely, the effect of the power noise is not large when the first read command READ1 is inputted to the command decoder 100, however, the effect of the power noise is large when the second read command READ2 is inputted to the command decoder 100 because of the increased delay of the latency signal, which may mean the data read from the memory during at least READ2 is unnecessarily delayed or even missed. For example, in a normal operation, the latency signal may be valid after the rising edge of clock CLK8 of the external clock ECLK, however the latency signal may be valid after the P sing edge of clock CLK9 due to the delay caused by the power noise.

The latency signal, delayed by the power noise, is input to the switching unit 120, and the switching unit 120 synchronizes the delayed latency signal with the internal clock ICLK1 to generate the PTRST signal which is an output buffer activating signal. The PTRST signal that is generated based on the first internal command signal READ1 is activated at the rising edge of a clock CLK6. However, the PTRST signal that is generated based on the internal command READ2 is activated at the rising edge of a clock CLK10 owing to the power noise. The output buffer 130 is activated based on the PTRST signal. In a normal case, the output data DOUT related to the internal command READ2 is initiated to be output at the rising edge of the clock CLK9. However, in fact, the output data DOUT is initiated to be output at the rising edge of the clock CLK10.

In FIG. 2, a DDR2 mode operation in which the 4-bit pre-fetch is performed upon input and output of the data is explained as an example. However, the delay problem of the output data due to the power noise may occur in any memory device that operates at high frequency.

SUMMARY

Embodiments according to the invention can provide methods and circuits for latency control in accessing memory devices. In some embodiments according to the invention, a method of providing a delay for access to a memory device can include adjusting a delay for access to data during memory operations based on at least one parameter associated with a reduction in voltage levels provided to the memory.

In some embodiments according to the invention, adjusting includes increasing the delay responsive determining a decreased frequency of memory operations are to be performed. The delay can be decreased responsive to determining an increased frequency of memory operations are to be performed.

In some embodiments according to the invention, increasing can include increasing loading on a generation of a latency signal and decreasing includes decreasing the loading on the generation of the latency signal. In some embodiments according to the invention, adjusting can include providing indications of receipt of memory operations to be performed to pipeline delay circuits and providing outputs from different stages of the pipeline delay circuits to a variable delay circuit to increase/decrease the delay.

In some embodiments according to the invention, the method can further includes increasing or decreasing loading on an output of a variable delay circuit based on outputs from different stages of the pipeline delay circuits. In some embodiments according to the invention, providing indications can include providing the indications to different pipeline delay circuits each associated with a different type of memory operation.

In some embodiments according to the invention, providing the indications to different pipeline delay circuits can include clocking the indications into a first stage of each of the different pipeline delay circuits synchronous with a clock signal provided to each of the different pipeline delay circuits. In some embodiments according to the invention, providing indications of receipt of memory operations to be performed to pipeline delay circuits can include providing the indications from successive stages of the different pipeline delay circuits to respective stages of the variable delay circuit.

In some embodiments according to the invention, increasing or decreasing loading can include increasing or decreasing loading by different amounts based on a type of memory operation to be performed. In some embodiments according to the invention, adjusting can include receiving indications of memory operations to be performed. The indications are provided to different pipeline delay circuits and to a variable delay circuit. The indications are clocked into input stages of the different pipeline delay circuits to provide staged outputs therefrom. The staged outputs are provided to the variable delay circuit. An increased/decreased delay can be provided to a latency signal generated by the variable delay circuit based on states of the staged outputs.

In some embodiments according to the invention, a method of providing a delay for access to a memory device can include providing a first delay for a latency signal generated by a variable delay circuit based on a first memory operation to be performed at a first time. The first delay can be decreased to a second delay based on a second memory operation to be performed at a second time after the first time to generate a second latency signal having the second delay. In some embodiments according to the invention, decreasing the first delay further can include decreasing the first delay to a second delay if the first and second memory operations are within a time interval of one another.

In some embodiments according to the invention, a circuit in an integrated circuit memory device for providing a delay for access to the memory device can include a variable delay circuit that is configured to adjust a delay for access to data during memory operations based on at least one parameter associated with a reduction in voltage levels provided to the memory. In some embodiments according to the invention, the parameters can be a type of memory operation to be performed, a number of memory operations to be performed, and/or a frequency at which the memory operations are to be performed.

In some embodiments according to the invention, the variable delay circuit is further configured to increase the delay responsive determining a decreased frequency of memory operations are to be performed and configured to decrease the delay responsive to determining an increased frequency of memory operations are to be performed.

In some embodiments according to the invention, the variable delay circuit is further configured to increase loading on a generation of a latency signal responsive to a decrease in frequency of memory operations to be performed and is further configured to decrease the loading on the generation of the latency signal responsive to a increase in frequency of memory operations to be performed.

DESCRIPTION OF EMBODIMENTS ACCORDING TO THE INVENTION

The invention now will be described more fully hereinafter with reference to the accompanying drawings, in which illustrative embodiments of the invention are shown. The invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As used herein the term "and/or" includes any and all combinations of one or more of the associated listed items.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
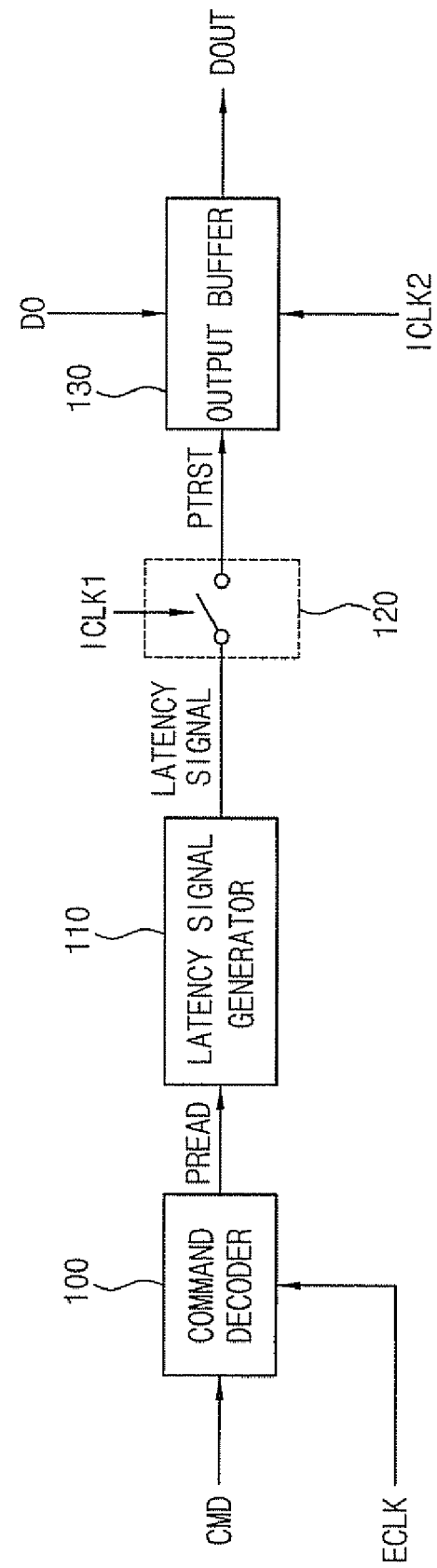
FIG. 1 is a block diagram illustrating a conventional latency control circuit.
Figure 2:
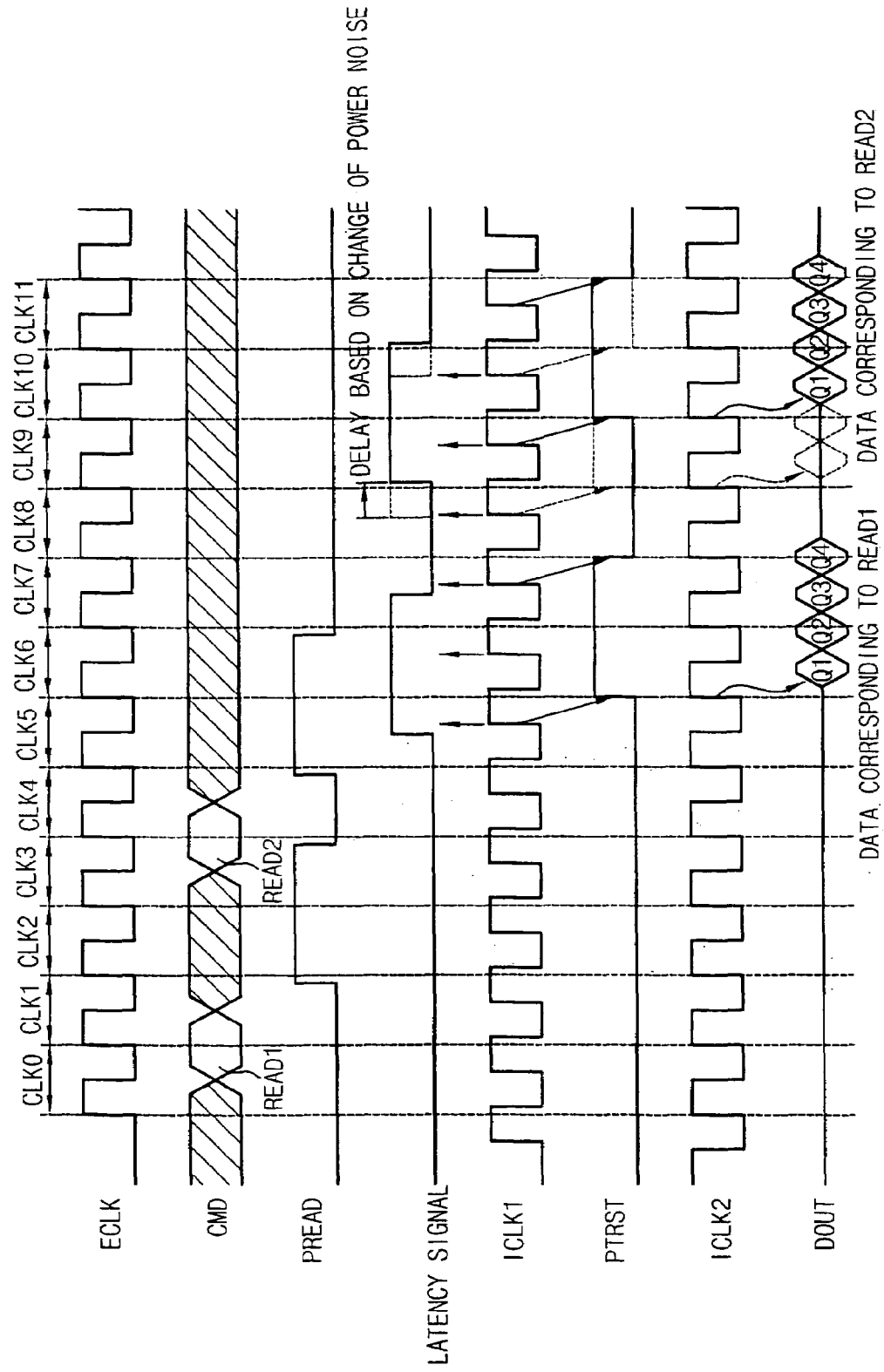
FIG. 2 is a timing diagram illustrating operations of the conventional latency control circuit.
Figure 3:
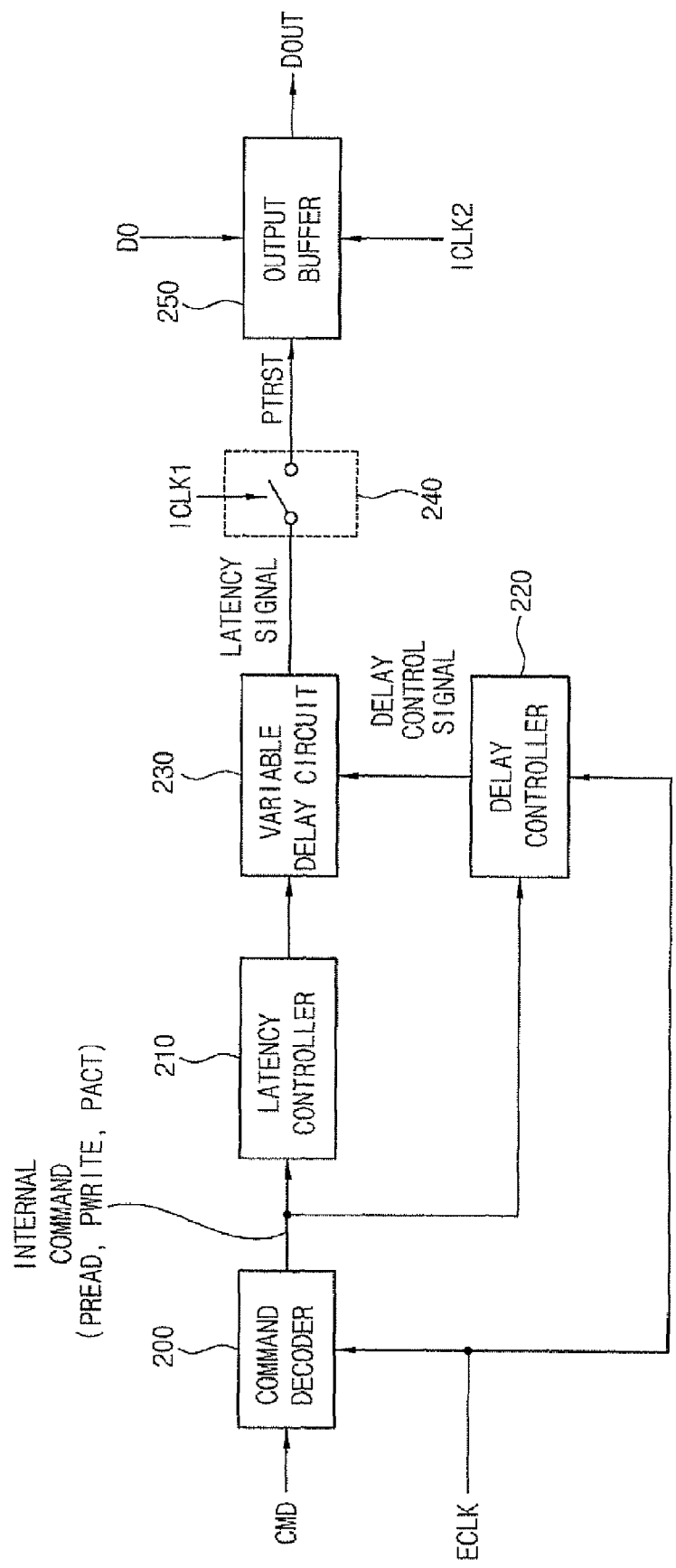
FIG. 3 is a block diagram illustrating variable delay control circuit and methods according to some embodiments of the present invention.

FIG. 3 is a functional block diagram illustrating schematically a variable delay control circuit according to an exemplary embodiment of the present invention. Referring to FIG. 3, the variable delay control circuit includes a command decoder 200, a latency controller 210, a delay controller, a variable delay circuit 230, a switching unit 240 and an output buffer 250.

The command decoder 200 decodes a command CMD to generate an internal command. In addition, the command decoder 200 synchronizes the internal command with an external clock ECLK to output a PREAD, a PWRITE, and a PACT, etc. by analyzing a row address strobe signal /RAS, a column address strobe signal /CAS, a write enable signal /WE and a chip select signal /CS, which are of CMOS-level and output from a command buffer (not shown), where the "/" before a signal name represents negative logic and the signals are activated when the signals are at "low" level in the negative logic.

The latency controller 210 delays the internal command output from the command decoder 200 by a predetermined clock to generate a delayed internal command.

The delay controller circuit 220 shifts the internal command in synchronization with the external clock ECLK. The delay controller circuit 220 includes a first shift path (or first delay pipeline) for shifting the internal command PREAD, a second shift path (or second delay pipeline) for shifting the internal command PWRITE and a third shift path (or third delay pipeline) for shifting the internal command PACT. Each of the shift paths includes a plurality of flip-flops (or other state type devices). An output of each of flip-flops controls an operation of the variable delay circuit 230.

The variable delay circuit 230 delays the delayed internal command, which is output from the latency controller 210, according to a delay control signal from the delay controller circuit 220 to output a latency signal. In addition, the variable delay circuit 230 includes a plurality of inverters coupled in series and delay circuits coupled to output terminals of the inverters. The delay circuit includes three pairs of transistors and capacitors coupled between transistors and VDD or VSS terminals.

The switching unit 240 synchronizes the latency signal with an internal clock ICLK1 output from a delay locked loop (DLL) (not shown) to output a PTRST signal, which is a signal for activating the output buffer 250. The output buffer 250 detects a D0 signal, which is output from an output latch (not shown), during an interval in which the activating signal PTRST is activated, to output a data output DOUT synchronized with an internal clock ICLK2.

As discussed above in reference to FIG. 3, the delay controller circuit 220 includes pipelined delay circuits for the different types of memory operations to be performed. The pipelined delay circuits can provide a record of memory operations to be performed and operations that have been performed in the past. Staged outputs from the delay controller circuit 220 can be used to adjust a delay for a latency signal generated by the variable delay circuit 230. In some embodiments according to the invention, the delay is adjusted based on at least one parameter that is associated with the reduction voltage levels provided to the memory. For example, the variable delay circuit 230 may generate a latency signal including an adjustable delay that is increased or decreased based on the frequency of memory operations performed. In this way, the delay can be, for example, increased when the memory device is operated at a lower frequency and may be decreased when the memory device is operating at a higher frequency. Decrease in the latency at higher frequency may compensate for delays associated with reductions in power levels that can accompany high frequency operations. Therefore, decreasing the delay included in the latency signal may offset the delay introduced by operation at a higher frequency. In some embodiments according to the invention, the delay can be increased by increasing the load on output stages included in the variable delay circuit 230. In some embodiments according to the invention, the delay can be decreased by decreasing the load on the stages of the variable delay circuit 230.

In still further embodiments according to the invention, the variable delay circuit 230 can generate the latency signal having a first delay based on a first memory operation that is performed at a first time. The first delay can be decreased to a second delay based on a second memory operation to be performed at a second time after the first time to generate a latency signal having a second delay. Accordingly, the variable delay circuit 230 can generate latency signals based on the times at which memory operations are performed including basing the adjustable delay on operations that were performed in the past relative to current memory operations.

Figure 4:
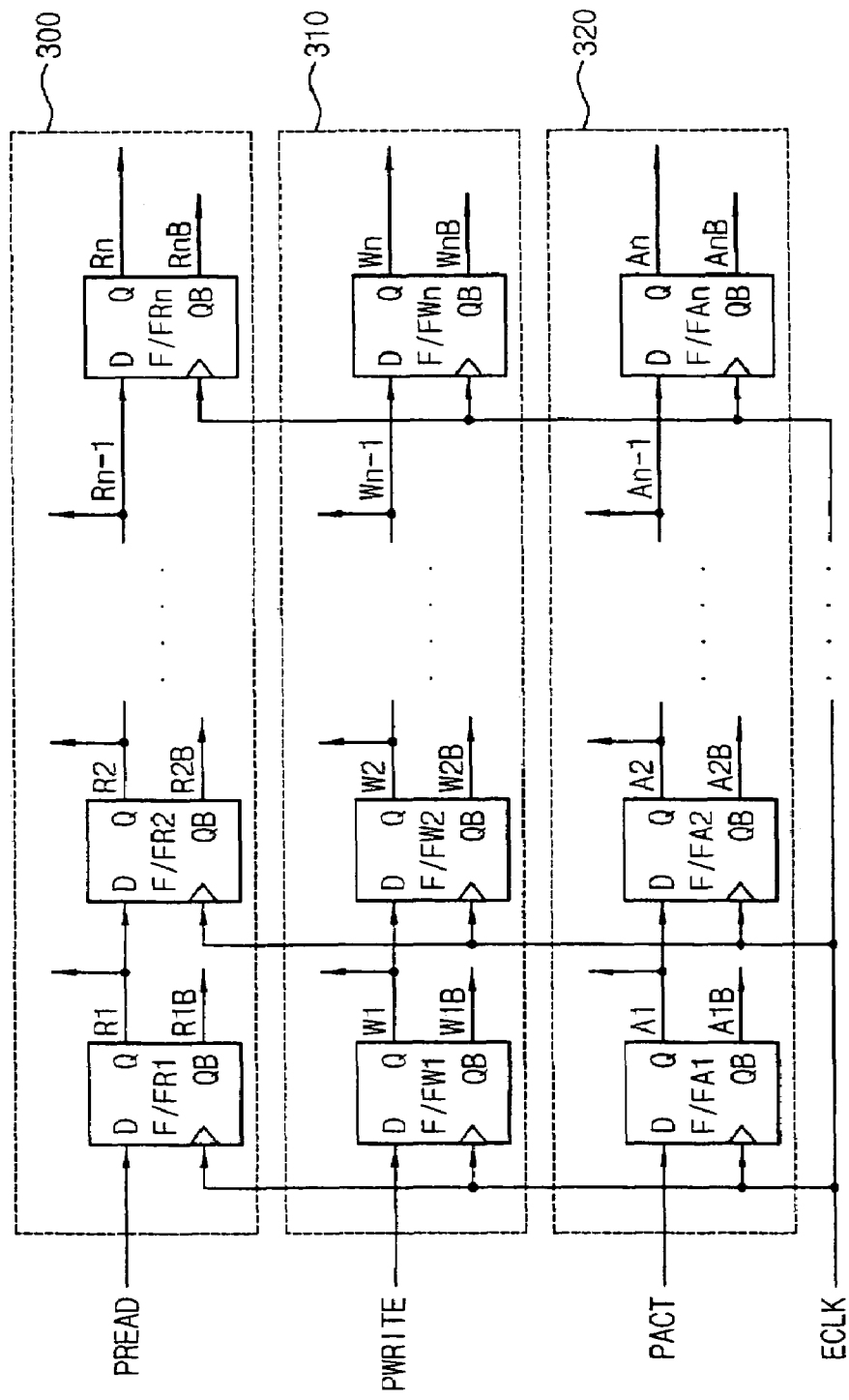
FIG. 4 is a circuit diagram illustrating a delay controller according to an embodiment of the present invention.

FIG. 4 is a detailed circuit diagram illustrating delay controller circuits and methods according to some embodiments of the present invention. Referring to FIG. 4, the delay controller circuit 220 includes the first shift path 300 (first delay pipeline), the second shift path 310 (second delay pipeline) and the third shift path 320 (third delay pipeline).

The first shift path 300 includes n flip-flops (or other state devices) coupled in series to shift the internal command PREAD in response to the external clock ECLK, wherein n is an integer greater than (or equal to) 1. Here, the flip-flop F/FR1 detects the PREAD signal at the rising edge of the external clock ECLK to output the PREAD signal to a R1 line. An inverted signal having a phase opposite to a phase of the signal on the R1 line is provided to a R1B line. The flip-flop F/FR2 detects the PREAD signal at the rising edge of the external clock ECLK to output the PREAD signal to a R2 line and a R2B line. The flip-flop F/FR2 detects the data on the R1 line after one clock compared to the detecting operation based on the external clock ECLK in the flip-flop F/FR1. An n-th flip-flop F/FRn of the flip-flops performs the same operation as the flip-flops F/FR1 and F/FR2 perform. However, the data detecting operation is performed based on the n-th external clock ECLK compared to the detecting operation based on the external clock ECLK in the flip-flop F/FR1.

The second shift path 310 includes n flip-flops (or other state devices) coupled in series to shift the internal command PWRITE in response to the external clock ECLK. Here, the flip-flop F/FW1 detects the PWRITE signal at the rising edge of the external clock ECLK to output the PWRITE signal to a W1 line. In addition, an inverted signal having a phase opposite to a phase of the signal on the W1 line is provided to a W1B line. The flip-flop F/FW2 detects the PWRITE signal at the rising edge of the external clock ECLK to output the PWRITE signal to a W2 line and a W2B line. The flip-flop F/FW2 detects the data on the W1 line after one clock compared to the detecting operation based on the external clock ECLK in the flip-flop F/FW1. An n-th flip-flop F/FWn of the flip-flops performs the same operation as the flip-flops F/FW1 and F/FW2 perform. However, the data detecting operation is performed based on the n-th external clock ECLK compared to the detecting operation based on the external clock ECLK in the flip-flop F/FW1.

The third shift path 320 includes n of flip-flops coupled in series to shift the internal command PACT in response to the external clock ECLK, wherein n is an integer greater than (or equal to) 1. The flip-flop F/FA1 detects the PACT signal at the rising edge of the external clock ECLK to output the PACT signal to an A1 line. An inverted signal having a phase opposite to a phase of the signal on the A1 line is provided to a A1B line. The flip-flop F/FA2 detects the PACT signal at the rising edge of the external clock ECLK to output the PACT signal to an A2 line and an A2B line. The flip-flop F/FA2 detects the data on the W1 line after one clock compared to the detecting operation based on the external clock ECLK in the flip-flop F/FA1. An n-th flip-flop F/FAn of the flip-flops performs the same operation as the flip-flops F/FA1 and F/FA2 perform. However, the data detecting operation is performed based on the n-th external clock ECLK compared to the detecting operation based on the external clock ECLK in the flip-flop F/FA1.

As described above in reference to FIG. 4, the delay circuit controller 220 includes different pipelined delay circuits, for example, for each type of different memory operation to be performed. Indications of the different types of memory operations(i.e. different types of memory commands to be performed are clocked into the different pipelined delay circuits to provide a record over time as to which memory operations have been/will be performed to provide staged outputs to the variable delay circuit 230. In particular, the low order stages of the pipelined delay circuits provide indications of memory operations to be performed whereas the higher order stages of the pipelined delay circuits can provide indications of memory operations performed before those that are clocked into the low order stages of the pipelined delay circuits.

Figure 5:
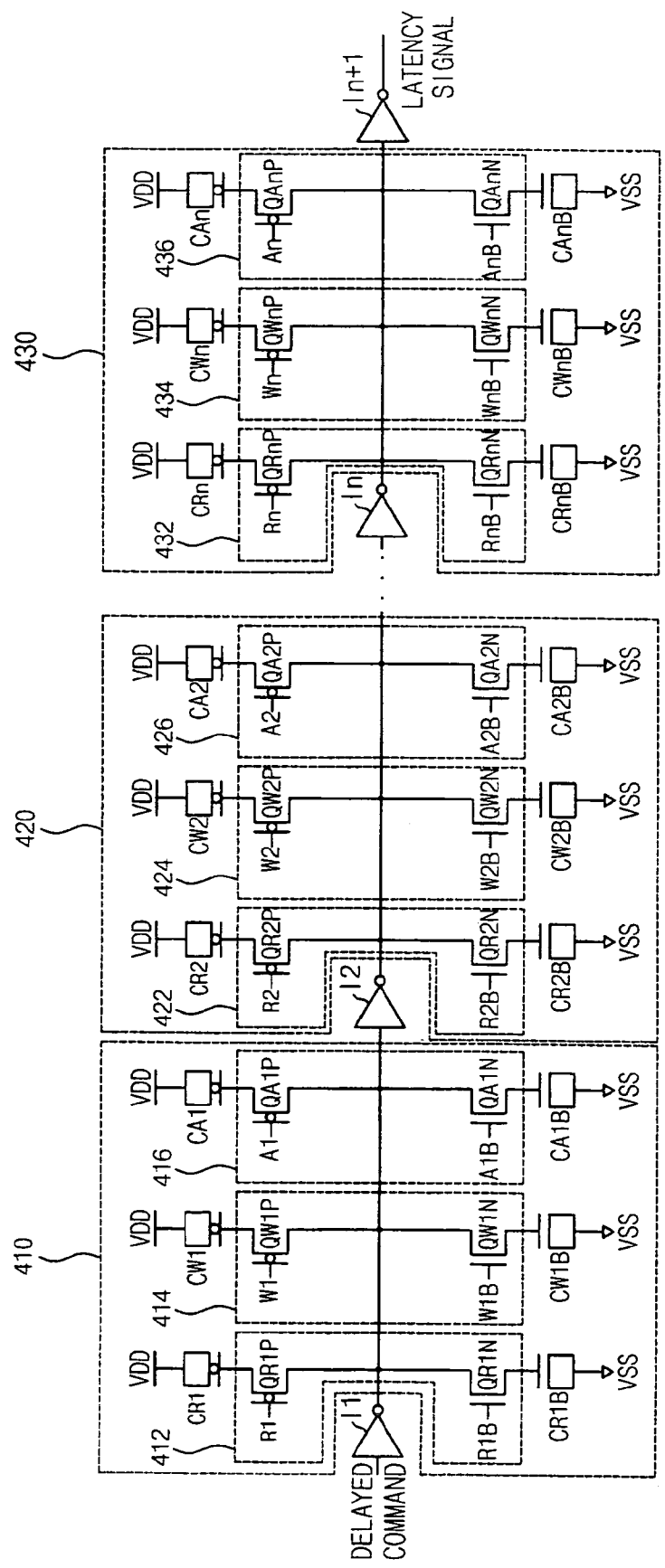
FIG. 5 is a circuit diagram illustrating a variable delay circuit according to an embodiment of the present invention.

FIG. 5 is a circuit diagram illustrating variable delay circuits and methods according to some embodiments of the present invention. Referring to FIG. 5, the variable delay circuit 230 includes a plurality of inverters and a plurality of delay circuits. The delayed command, which is output from the latency controller 210, is input to an inverter I1 of the variable delay circuit 230, and a signal delayed by the delaying operation of a first delay circuit 410 is output.

The first delay circuit 410 controls an operation of delaying the output signal from the inverter I1 according to control signals on the R1, R1B, W1, W1B, A1 and A1B lines which are the output lines of the delay controller circuit 220. The first delay circuit 410 includes three pairs of transistors and capacitors coupled between transistors and VDD or VSS terminals.

A first transistor pair 412 includes a PMOS transistor QR1P and an NMOS transistor QR1N. R1, which is an output line of the delay controller circuit 220, is coupled to a gate of the transistor QR1P, a drain of the transistor QR1P is coupled to the output terminal of the inverter I1, a source of the transistor QR1P is coupled to one terminal of a capacitor CR1, and the other terminal of the capacitor CR1 is coupled to VDD. R1B, which is the output line of the delay controller circuit 220, is coupled to a gate of the transistor QR1N, a drain of the transistor QR1N is coupled to the output terminal of the inverter I1, a source of the transistor QR1N is coupled to one terminal of a capacitor CR1B, and the other terminal of the capacitor CR1B is coupled to VSS.

A second transistor pair 414 includes a PMOS transistor QW1P and a NMOS transistor QW1N. W1, which is the output line of the delay controller circuit 220, is coupled to a gate of the transistor QW1P, a drain of the transistor QW1P is coupled to the output terminal of the inverter I1, a source of the transistor QW1P is coupled to one terminal of a capacitor CW1, and the other terminal of the capacitor CW1 is coupled to VDD. W1B, which is the output line of the delay controller circuit 220, is coupled to a gate of the transistor QW1N, a drain of the transistor QW1N is coupled to the output terminal of the inverter I1, a source of the transistor QW1N is coupled to one terminal of a capacitor CW1B, and the other terminal of the capacitor CW1B is coupled to VSS.

A third transistor pair 416 includes a PMOS transistor QA1P and a NMOS transistor QA1N. A1, which is the output line of the delay controller circuit 220, is coupled to a gate of the transistor QA1P, a drain of the transistor QA1P is coupled to the output terminal of the inverter I1, a source of the transistor QA1P is coupled to one terminal of a capacitor CA1, and the other terminal of the capacitor CA1 is coupled to VDD. A1B, which is the output line of the delay controller circuit 220, is coupled to a gate of the transistor QA1N, a drain of the transistor QA1N is coupled to the output terminal of the inverter I1, a source of the transistor QA1N is coupled to one terminal of a capacitor CA1B, and the other terminal of the capacitor CA1B is coupled to VSS.

In case where there is no input of command, since the internal command is not activated, all signals on the R1, W1 and A1 lines are at a low level and all signals on the R1B, W1B and A1B lines are at a high level. Accordingly, all transistors of the first delay circuit 410 are turned-on and the output of the inverter I1 is delayed to the maximum by the coupling of all capacitors included in the first delay circuit 410.

When the command PREAD is activated, at a first clock of the external clock ECLK, the signal on the R1 line has a high level and the signal on the R1B has a low level, whereas the remainder of the inputs from the delay controller circuit 220 are in respective states described above with reference to no command being input. As a result, the transistors of the first transistor pair 412 are turned-off (and the remainder turned-on), and the output of the inverter I1 is delayed for a time determined based on the values of the capacitors CW1, CW1B, CA1 and CA1B, which are coupled to the output terminal of the inverter I1 (reducing the delay provided to the output of the inverter I1). Furthermore, when the command PWRITE is activated, the signal on the W1 line has a high level and the signal on the W1B has at a low level, so that the transistors of the second transistor pair 414 are turned-off (further reducing the delay provided to the output of the inverter I1). In addition, when the command PACT is activated, the signal on the A1 line has a high level and the signal on the A1B has a low level, so that the transistors of the third transistor pair 416 are turned-off (further reducing the delay provided to the output of the inverter I1).

The output signal of the inverter I1 is delayed by the first delay circuit 410 and is input to an inverter I2. A second delay circuit 420 is coupled to the output terminal of the inverter I2. The second delay circuit 420 includes three pairs of transistors, and capacitors coupled between the transistors and VDD or VSS terminals.

In the second delay circuit 420, a fourth transistor pair 422 includes a transistor QR2P operated in response to a control signal on a R2 line, and a transistor QR2N operated in response to a control signal on a R2B. A drain of the transistor QR2P is coupled to the output terminal of the inverter I2, and a source of the transistor QR2P is coupled to one terminal of a capacitor CR2. The other terminal of the capacitor CR2 is coupled to VDD. Furthermore, a drain of the transistor QR2N is coupled to the output terminal of the inverter I2, and a source of the transistor QR2N is coupled to one terminal of a capacitor CR2B. In addition, the other terminal of the capacitor CR2B is coupled to VSS.

And, a fifth transistor pair 424 includes a transistor QW2P operated in response to a control signal on a W2 line, and a transistor QW2N operated in response to a control signal on a W2B. A drain of the transistor QW2P is coupled to the output terminal of the inverter I2, and a source of the transistor QW2P is coupled to one terminal of a capacitor CW2. The other terminal of the capacitor CW2 is coupled to VDD. Furthermore, a drain of the transistor QW2N is coupled to the output terminal of the inverter I2, and a source of the transistor QW2N is coupled to one terminal of a capacitor CW2B. In addition, the other terminal of the capacitor CW2B is coupled to VSS.

In addition, a sixth transistor pair 426 includes a transistor QA2P operated in response to a control signal on a A2 line, and a transistor QA2N operated in response to a control signal on a A2B. And, a drain of the transistor QA2P is coupled to the output terminal of the inverter I2, and a source of the transistor QA2P is coupled to one terminal of a capacitor CA2. The other terminal of the capacitor CA2 is coupled to VDD. Furthermore, a drain of the transistor QA2N is coupled to the output terminal of the inverter I2, and a source of the transistor QA2N is coupled to one terminal of a capacitor CA2B. In addition, the other terminal of the capacitor CA2B is coupled to VSS. The second delay circuit 420 controls the delay of the output signal from the inverter I2 in response to the delay control signal output from the delay controller circuit 220 at a second clock of the external clock ECLK.

A signal to an inverter In is inverted, and is delayed by an n-th delay circuit 430 coupled to an output terminal of the inverter In. The n-th delay part 430 includes three pairs of transistors, and capacitors coupled between the transistors and VDD or VSS terminals. In the n-th delay circuit 430, a seventh transistor pair 432 includes a transistor QRnP operated in response to a control signal on a Rn line, and a transistor QRnN operated in response to a control signal on a RnB. And, a drain of the transistor QRnP is coupled to the output terminal of the inverter In, and a source of the transistor QRnP is coupled to one terminal of a capacitor CRn. The other terminal of the capacitor CRn is coupled to VDD. A drain of the transistor QRnN is coupled to the output terminal of the inverter In, and a source of the transistor QRnN is coupled to one terminal of a capacitor CRnB. The other terminal of the capacitor CRnB is coupled to VSS.

An eighth transistor pair 434 includes a transistor QWnP operated in response to a control signal on a Wn line, and a transistor QWnN operated in response to a control signal on a WnB. A drain of the transistor QWnP is coupled to the output terminal of the inverter In, and a source of the transistor QWnP is coupled to one terminal of a capacitor CWn. The other terminal of the capacitor CWn is coupled to VDD. Furthermore, a drain of the transistor QWnN is coupled to the output terminal of the inverter In, and a source of the transistor QWnN is coupled to one terminal of a capacitor CWnB. In addition, the other terminal of the capacitor CWnB is coupled to VSS.

In addition, a ninth transistor pair 436 includes a transistor QAnP operated in response to a control signal on a An line, and a transistor QAnN operated in response to a control signal on a AnB. A drain of the transistor QAnP is coupled to the output terminal of the inverter In, and a source of the transistor QANP is coupled to one terminal of a capacitor CAn. The other terminal of the capacitor CAn is coupled to VDD. Furthermore, a drain of the transistor QAnN is coupled to the output terminal of the inverter In, and a source of the transistor QAnN is coupled to one terminal of a capacitor CAnB. The other terminal of the capacitor CAnB is coupled to VSS.

The n-th delay circuit 430 controls the delay of the output signal from the inverter In according to the delay control signal output from the delay controller circuit 220 at a n-th clock of the external clock ECLK. For example, an inverter In+1 is coupled to the output of the inverter In, thereby reducing or minimizing the influence of an input impedance to the switching unit 240 to which the latency signal is input.

In some embodiments according to the invention, a capacitance of the capacitor can be varied depending upon an operation mode of a memory device. In some embodiments according to the invention, a capacitance at the activating operation based on the PACT signal, a capacitance at the read operation based on the PREAD signal and a capacitance at the write operation based on the PWRITE signal can be set to values different from each other. In addition according to the operating frequency, the capacitance of the capacitor can be differently set. That is, to minimize or reduce the effects of power noise according to the operating frequency, it is desirable that a proper capacitance be set.

As described above in reference to FIG. 5, the staged outputs of the delay controller circuit 220 are provided to corresponding stages of the variable delay circuit 230. In particular, the indications of the memory operations to be performed (and those having been performed) are provided to delay circuits to increase/decrease the loading on the output of the corresponding stage of the variable delay circuit 230. Furthermore, as shown in FIG. 5, the staged outputs can be used to adjust the variable delay by increasing/decreasing the capacitive load on the corresponding stage of the variable delay circuit 230 by turning on/off the corresponding transistor pair coupled to VDD and VSS. Therefore, in operation according to embodiments of the invention, the signal generated by the latency controller circuit 210 passes through the variable delay circuit 230 and experiences the adjustable delay based on the memory operations that will be performed and/or have been performed. It will be understood that the memory operations to be performed can be evidenced by the staged outputs from the low order stages of the pipelined delay circuits in the delay controller circuit 220 where as the memory operations that have already been performed can be evidenced by the higher order stages of the pipelined delay circuits.

Figure 6:
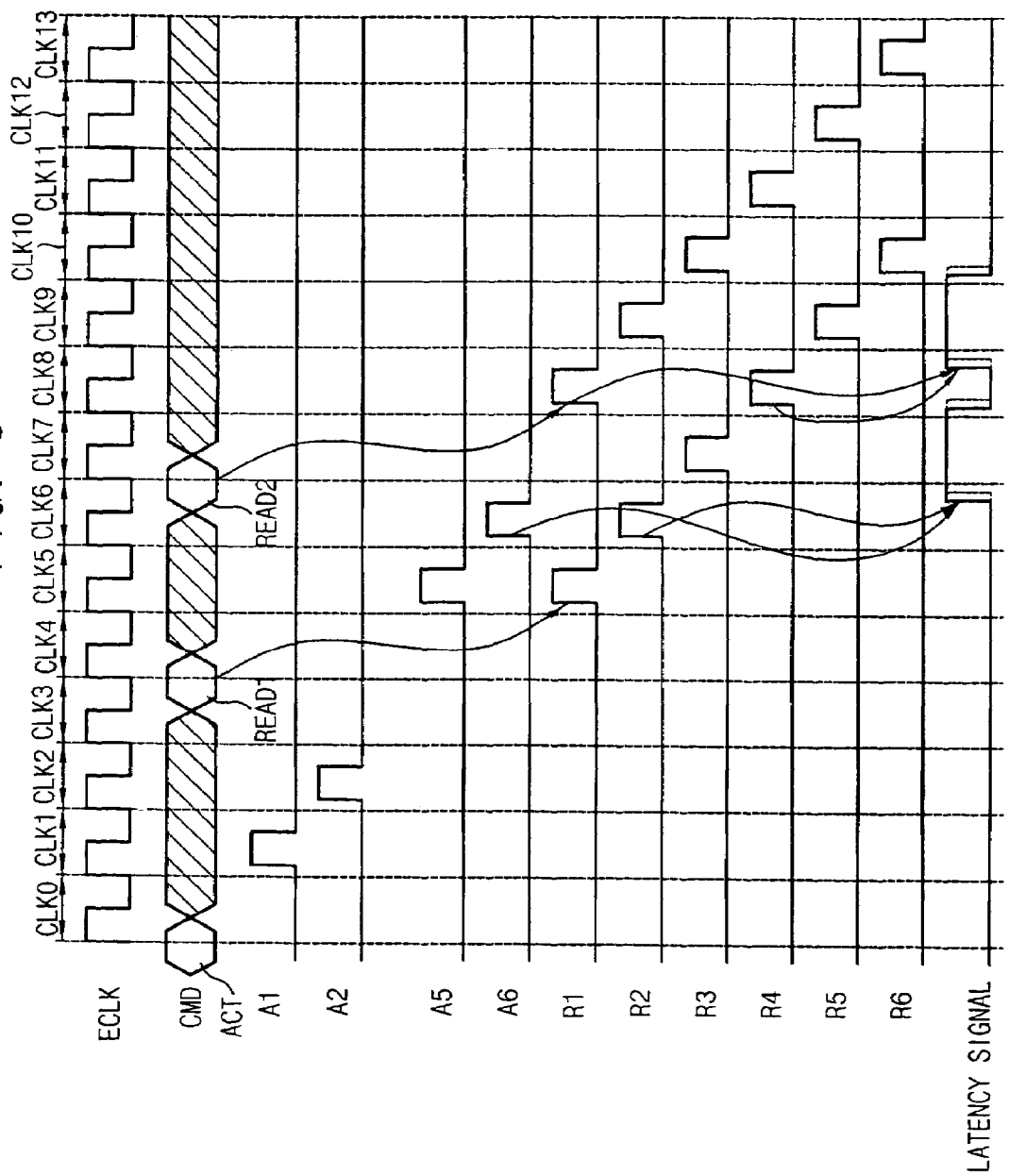
FIG. 6 is a timing diagram illustrating operations of the variable delay control circuit according to an embodiment of the present invention.

FIG. 6 is a timing diagram illustrating operations of the variable delay control circuit according to an embodiment of the present invention. Referring to FIG. 6, the internal activating command PACT is generated by an activating command ACT detected at a rising edge of a clock CLK0 of the external clock ECLK. The internal activating command PACT is detected at the rising edge of a clock CLK1, and is input to the third shift path of the delay controller circuit 220 shown in FIG. 4. The internal activating command PACT detected at the rising edge of the clock CLK1 is output to the A1 line which is the output line of the flip-flop F/FA1 on the third shift path, and is inverted to be output to another output line A1B thereof.

The signal on the output line A1 of the flip-flop F/FA1 is shifted to the flip-flop F/FA2. In other words, the signal on the output line A1 is detected at the rising edge of a clock CLK2 to be output to the output line A2, and is inverted to be output to another output line A2B.

According to operations of some embodiments of the invention as described above, the delay control signal is output to output lines A3 and A3B of a flip-flop F/FA3 at a rising edge of a clock CLK3, the delay control signal is output to output edge of a clock CLK5, and the delay control signal is output to output lines A6 and A6B of a flip-flop F/FA6 at a rising edge of a clock CLK6.

The internal activating command PREAD1 is generated by a read command READ1 detected at the rising edge of the clock CLK4 of the external clock ECLK. The internal read command PREAD1 is detected at the rising edge of the clock CLK5, and is input to the first shift path of the delay controller circuit 220 of FIG. 4. In addition, the internal read command PREAD1 detected at the rising edge of the clock CLK5 is output to the R1 line, which is the output line of the flip-flop F/FR1 on the first shift path, and is inverted to be output to another output line R1B thereof. The signal on the output line R1 of the flip-flop F/FR1 is shifted to the flip-flop F/FR2. That is, the signal on the output line R1 is detected at the rising edge of a clock CLK6 to be output to the output line R2, and is inverted to be output to another output line R2B.

The delay control signal is output to output lines R3 and R3B of a flip-flop F/FR3 at a rising edge of a clock CLK7, the delay control signal is output to output lines R4 and R4B of a flip-flop F/FR4 at a rising edge of a clock CLK8, the delay control signal is output to output lines R5 and R5B of a flip-flop F/FR5 at a rising edge of a clock CLK9, and the delay control signal is output to output lines R6 and R6B of a flip-flop F/FR6 at a rising edge of a clock CLK10.

In addition, the internal activating command PREAD2 is generated by a read command READ2 detected at the rising edge of the clock CLK7 of the external clock ECLK. The internal read command PREAD2 is detected at the rising edge of the clock CLK8, and is input to the first shift path of the delay controller circuit 220 of FIG. 4. In addition, the internal read command PREAD2 detected at the rising edge of the clock CLK8 is output to the R1, which is the output line of the flip-flop F/FR1 on the first shift path, and is inverted to be output to another output line R1B thereof. The signal on the output line R1 of the flip-flop F/FR1 is shifted to the flip-flop F/FR2. In other words, the signal on the output line R1 is detected at the rising edge of a clock CLK9 to be output to the output line R2, and is inverted to be output to another output line R2B.

The delay control signal is output to output lines R3 and R3B of a flip-flop F/FR3 at a rising edge of a clock CLK10, the delay control signal is output to output lines R4 and R4B of a flip-flop F/FR4 at a rising edge of a clock CLK11, the delay control signal is output to output lines R5 and R5B of a flip-flop F/FR5 at a rising edge of a clock CLK12, and the delay control signal is output to output lines R6 and R6B of a flip-flop F/FR6 at a rising edge of a clock CLK13.

The delay control signals, which are synchronized with the external clock ECLK, controls the on-off operation of the transistors of the variable delay circuit 230. At the clock CLK6 of the external clock ECLK, the latency signal for READ1 is generated. The latency signal is that the delay operation is controlled by the control signals on the lines A6 and R2. Accordingly, the delay for READ1 is controlled according to two control signals, so that the influence due to the power noise can be minimized or reduced.

Furthermore, the delay operation for the second generated latency signal (i.e., for READ2) is controlled according to the control signals on the R1 and R4 lines. As described above, a CAS latency can be varied according to the type of the memory devices, and the delay of the latency signal can be controlled based on the operating frequency or the operating mode of the memory device.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed:

1. A method of providing a delay for access to a memory device comprising:
adjusting the delay for access to data during memory operations based on a type of memory operation to be performed and/or a frequency at which the memory operations are to be performed, wherein said adjusting comprises:
providing indications of receipt of previously performed memory operations and memory operations to be performed to pipeline delay circuits; and
providing outputs from different stages of the pipeline delay circuits to a variable delay circuit to increase/decrease the delay based on the indications, wherein said providing indications of receipt of memory operations to be performed to pipeline delay circuits comprises providing the indications to different pipeline delay circuits each associated with a different type of memory operation.

2. The method according to claim 1 further comprising:
increasing or decreasing loading on an output of the variable delay circuit based on outputs from the different stages of the pipeline delay circuits.

3. The method according to claim 1 wherein said providing the indications to different pipeline delay circuits comprises clocking the indications into a first stage of each of the different pipeline delay circuits synchronous with a clock signal provided to each of the different pipeline delay circuits.

4. The method according to claim 1 wherein said providing indications of receipt of memory operations comprises providing the indications from successive stages of the pipeline delay circuits to respective stages of the variable delay circuit.

5. The method according to claim 2 wherein said increasing or decreasing loading comprises increasing or decreasing loading by different amounts based on a type of memory operation to be performed.

6. The method according to claim 1 wherein said adjusting comprises:
receiving indications of memory operations to be performed;
providing the indications to different pipeline delay circuits and providing the indications to a variable delay circuit;
clocking the indications into input stages of the different pipeline delay circuits to provide staged outputs therefrom;

providing the staged outputs to the variable delay circuit; and increasing or decreasing a delay of a latency signal generated by the variable delay circuit based on states of the staged outputs.

7. A circuit for controlling a variable delay comprises:

a latency controller configured to process an internal command to output a delayed internal command;

a delay controller configured to receive the internal command to generate at least two delay control signals based on a type of memory operation and/or a frequency at which the memory operations are to be performed; and a variable delay circuit configured to delay the delayed internal command based on the at least two delay control signals, wherein the delay controller is further configured to adjust delays introduced into the delay control signals by providing indications of receipt of previously performed memory operations and memory operations to be performed to pipeline delay circuits and by providing outputs from different stages of the pipeline delay circuits to the variable delay circuit to increase/decrease the delay, wherein the delay controller comprises:

a first shift path configured to shift an internal activating command;

a second shift path configured to shift an internal write command; and a third shift path configured to shift an internal read command.

8. The circuit according claim 7 wherein each of the shift paths comprises a plurality of flip-flops coupled in series.

9. The circuit according to claim 8 wherein the delay control signal is generated from each of the plurality of flip-flops.

10. The circuit according to claim 7 wherein the variable delay circuit includes:

a plurality of inverters coupled in series; and a plurality of delay circuits, each of which is coupled to an output terminal of each of the inverters.

11. The circuit according to claim 10 wherein the variable delay circuit includes:

three pairs of transistors coupled in common to the output terminal of one of the plurality of inverters; and capacitors coupled between source terminals of the transistors and a VDD terminal or a VSS terminal.

12. The circuit according to claim 11, wherein the three pairs of transistors includes:

a first transistor pair configured to be controlled in response to a first delay control signal related to an internal write command;

a second transistor pair configured to be controlled in response to a second delay control signal related to an internal read command; and a third transistor pair configured to be controlled in response to a third delay control signal related to an internal activating command.

* * * * *

UNITED STATES PATENT AND TRADEMARK OFFICE
CERTIFICATE OF CORRECTION

PATENT NO. : 7,292,486 B2  Page 1 of 1
APPLICATION NO. : 11/008462
DATED : November 6, 2007
INVENTOR(S) : Lee It is certified that error appears in the above-identified patent and that said Letters Patent is hereby corrected as shown below:

Column 2, Line 37: Please correct "after the P sing edge"
to read -- after the rising edge --

Column 7, Line 33-34: Please correct: "memory commands to be"
to read -- memory commands) to be--

Signed and Sealed this

Twenty Second Day of April, 2008

JON W. DUDAS
*Director of the United States Patent and Trademark Office*